US 12,152,870 B2

(12) United States Patent
Seurin et al.

(10) Patent No.: US 12,152,870 B2
(45) Date of Patent: Nov. 26, 2024

(54) SENSING METHOD AND SENSOR SYSTEM

(71) Applicant: ams Sensors Asia Pte. Ltd., Singapore (SG)

(72) Inventors: Jean-Francois Seurin, Princeton Junction, NJ (US); Goran Stojanovic, Ruschlikon (CH); Laurent Nevou, Ruschlikon (CH)

(73) Assignee: AMS SENSORS ASIA PTE. LTD., Singapore (SG)

( * ) Notice: Subject to any disclaimer, the term of this patent is extended or adjusted under 35 U.S.C. 154(b) by 174 days.

(21) Appl. No.: 17/795,986

(22) PCT Filed: Feb. 3, 2021

(86) PCT No.: PCT/SG2021/050054
§ 371 (c)(1),
(2) Date: Jul. 28, 2022

(87) PCT Pub. No.: WO2021/158176
PCT Pub. Date: Aug. 12, 2021

(65) Prior Publication Data
US 2023/0047060 A1  Feb. 16, 2023

Related U.S. Application Data

(60) Provisional application No. 62/971,342, filed on Feb. 7, 2020.

(51) Int. Cl.
*G01B 11/02* (2006.01)
*G01D 5/26* (2006.01)
(Continued)

(52) U.S. Cl.
CPC ........... *G01B 11/026* (2013.01); *G01D 5/266* (2013.01); *G01H 9/00* (2013.01); *H04R 29/001* (2013.01); *H01S 5/183* (2013.01)

(58) Field of Classification Search
CPC ........ G01B 11/026; G01D 5/266; G01H 9/00; H04R 29/001; H01S 5/183; G01L 9/0077
See application file for complete search history.

(56) References Cited

U.S. PATENT DOCUMENTS

2003/0002129 A1* 1/2003 Kobayashi ............. H04R 23/00
359/285
2006/0192976 A1* 8/2006 Hall .................... G01B 9/02051
356/521
(Continued)

FOREIGN PATENT DOCUMENTS

| CN | 102057337 A | 5/2011 |
| CN | 107005023 A | 8/2017 |
| WO | 2017/218467 A1 | 12/2017 |

OTHER PUBLICATIONS

International Search Report for corresponding International Application No. PCT/SG2021/050054 dated Jun. 21, 2021.
(Continued)

*Primary Examiner* — Jonathan M Hansen
(74) *Attorney, Agent, or Firm* — VIERING JENTSCHURA & PARTNER mbB

(57) ABSTRACT

Sensing Method and Sensor System A sensing method comprises using a vertical cavity surface emitting laser (VCSEL) to oscillate and emit a laser beam. A diaphragm is used to reflect a portion of the laser beam back into the VCSEL. This method can be referred as self mixing interferometry. A current or voltage at the VCSEL is monitored, and is used to sense movement of the diaphragm. This allows a property external to the VCSEL to be sensed without using a photo-detector.

18 Claims, 10 Drawing Sheets

(51) Int. Cl.
  *G01H 9/00* (2006.01)
  *H04R 29/00* (2006.01)
  *H01S 5/183* (2006.01)

(56) References Cited

U.S. PATENT DOCUMENTS

| | | | |
|---|---|---|---|
| 2011/0075692 A1 | 3/2011 | Moench | |
| 2012/0318041 A1 | 12/2012 | Youngner et al. | |
| 2016/0245687 A1* | 8/2016 | Digonnet | G02B 6/32 |
| 2019/0097393 A1 | 3/2019 | Moench et al. | |
| 2019/0317454 A1* | 10/2019 | Holenarsipur | G04C 3/005 |
| 2019/0317639 A1* | 10/2019 | Winkler | G01P 3/366 |
| 2019/0331828 A1* | 10/2019 | Mutlu | G06F 3/0416 |
| 2020/0374620 A1* | 11/2020 | McCord | H04R 1/1041 |
| 2021/0400397 A1* | 12/2021 | Stojanovic | G01H 9/00 |

OTHER PUBLICATIONS

International Preliminary Report on Patentability for related application No. PCT/SG2021/050054 dated Aug. 18, 2022 (11 Pages).

Xiaolin Qiu et al., "2. Vertical cavity surface emitting semiconductor laser (VCSEL)" in: Laser Optics Technology and Applications, Jiangxi Science and Technology Press 2013, p. 95, 1 page of the translation, 4 pages of the original.

Chinese office action issued for the parallel Chinese patent application No. 2021800133919, dated Jul. 9, 2024, 7 pages (for informational purposes only).

First Search Report issued for the parallel Chinese patent application No. 2021800133919, dated Sep. 8, 2023, 1 page (for informational purposes only).

IEEE, "Call for Papers Special Issue of the Journal of Lightwave Technology on High Speed Technology for Lightwave Applications", Journal of Lightwave Technology, Oct. 1986, 8 pages, vol. LT-4, No. 10.

IEEE, "External optical feedback effects on semiconductor injection laser properties", IEEE Journal of Quantum Electronics, Mar. 1980, pp. 347-355, vol. QE-16, No. 3.

Chinese office action issued for the corresponding Chinese patent application No. 2021800133919, dated May 1, 2024, 5 pages (for informational purposes only).

* cited by examiner

SENSING METHOD AND SENSOR SYSTEM

TECHNICAL FIELD OF THE DISCLOSURE

The disclosure relates to a sensing method and sensor system, particularly but not exclusively to a sensing method which may be used by a mobile phone and a sensor system which may form part of a mobile phone.

BACKGROUND OF THE DISCLOSURE

The present disclosure relates to a sensing method which may for example be used by a mobile phone. The disclosure also relates to a sensor system which may for example form part of a mobile phone.

Mobile phones typically include a variety of sensors together with associated systems. These may be used for example to sense sound waves, detect ambient light, obtain images, etc. Sensor systems which are used in a mobile phone may be complex and expensive to fabricate. As such, sensor systems contribute to the overall cost of a mobile phone. There is an ongoing desire to simplify and/or reduce the cost of sensor systems in mobile phones and in other apparatus.

It is an aim of the present disclosure to address one or more of the problems above.

SUMMARY

In general, this disclosure proposes to overcome the above problems by using a sensing method which is based around a vertical cavity surface emitting laser (VCSEL) without requiring a photodiode or other optical detector. The method may for example be used to monitor sound (the sensor may be an audio sensor). The current and/or voltage which is supplied to the VCSEL is monitored and provides the sensor output. As such no photo-detector is required. This is advantageous because it reduces the complexity of the sensor system used by the method, and may also reduce the cost of the sensor system.

According to one aspect of the present disclosure, there is provided a sensing method comprising driving a vertical cavity surface emitting laser (VCSEL) to oscillate and emit a laser beam, using a diaphragm to reflect a portion of the laser beam back into the VCSEL, and monitoring the electrical power drawn by the VCSEL to sense movement of the diaphragm. This method may be referred to as self-mixing interferometry.

Pressure waves such as acoustic waves may be sensed by the sensing method.

A hole may be provided in the diaphragm. The hole may have a diameter of at least 1 micron. The hole may have a diameter of up to 4 microns.

Changes of ambient pressure may be sensed by the sensing method. Then ambient pressure is being sensed the diaphragm may be provided without a hole.

A known current may be applied to the VCSEL and a voltage at the VCSEL may be monitored. The known current may be a DC current. The DC current may be chopped.

A known voltage may be applied to the VCSEL and a current at the VCSEL is monitored. The known voltage may be a DC voltage. The DC voltage may be chopped.

An oscillating signal is may be supplied to the VCSEL, and a lock-in amplifier may be used to monitor for movement of the diaphragm at a frequency of the oscillating signal.

According to a further aspect of the invention there is provided a sensing method comprising driving a vertical cavity surface emitting laser (VCSEL) to oscillate and emit a laser beam, using a diaphragm to reflect a portion of the laser beam back into the VCSEL, allowing ambient gas to enter a volume between the diaphragm and a surface of the VCSEL, and monitoring the electrical power drawn by the VCSEL to sense changes of the refractive index of the ambient gas.

According to a still further aspect of the invention there is provided a sensing method comprising driving a vertical cavity surface emitting laser (VCSEL) to oscillate and emit a laser beam, using a diaphragm to reflect a portion of the laser beam back into the VCSEL, allowing ambient gas to enter a volume between the diaphragm and a surface of the VCSEL, and using the power drawn by the VCSEL to sense changes of a reflectivity of the diaphragm caused by a build-up of material on the diaphragm.

According to a still further aspect of the invention there is provided a sensor system comprising a vertical cavity surface emitting laser (VCSEL) and a diaphragm spaced away from a laser beam emitting surface of the VCSEL, wherein the sensor system further comprises drive and sensing electronics configured to provide a known current to the VCSEL and measure a voltage at the VCSEL or to apply a known voltage to the VCSEL and measure a current provided to the VCSEL, and wherein the sensor system further comprises signal processing electronics configured to receive a signal output from the drive and sensing electronics and to use the signal to monitor movement of the diaphragm.

A hole may be provided in the diaphragm.

The hole may have a diameter of at least 1 micron.

The diaphragm may have a thickness of 500 nm or less. The diaphragm may have a thickness of 20 nm or more. The diaphragm may have a thickness of 50 nm or more.

A separation between the diaphragm and the VCSEL may be 100 microns or more. A separation between the diaphragm and the VCSEL may be up 750 microns.

The diaphragm may be supported by a spacer which extends from a surface of the VCSEL.

The diaphragm may be supported by a spacer which extends from a surface of a support substrate which also supports the VCSEL.

The VCSEL may be a bottom emitting VCSEL. The VCSEL may be a top emitting VCSEL.

The sensing electronics may comprise a lock-in amplifier.

According to a still further aspect of the invention there is provided a sensor system comprising a vertical cavity surface emitting laser (VCSEL) and a diaphragm spaced away from a laser beam emitting surface of the VCSEL, an opening being provided which allows gas to enter a volume between the diaphragm and the VCSEL, wherein the sensor system further comprises drive and sensing electronics configured to provide a known current to the VCSEL and measure a voltage at the VCSEL or to apply a known voltage to the VCSEL and measure a current provided to the VCSEL, and wherein the sensor system further comprises signal processing electronics configured to receive a signal output from the drive and sensing electronics and to use the signal to monitor a change of refractive index of gas in the volume or to monitor a change of reflectivity of the diaphragm.

The diaphragm may have a thickness of 2 microns or more.

Thus, embodiments of this disclosure provide a sensing method and system which allows for various properties external to the VCSEL to be sensed without requiring use of a photo-detector. The properties external to the VCSEL may include pressure waves (e.g. acoustic waves), vibrations, ambient pressure changes, gas refractive index changes, and build-up of material on the diaphragm.

Finally, the present display system disclosed here utilises a novel approach at least in that a VCSEL is used to sense properties external to the VCSEL without using a photo-detector.

BRIEF DESCRIPTION OF THE PREFERRED EMBODIMENTS

Some embodiments of the disclosure will now be described by way of example only and with reference to the accompanying drawings, in which:

FIG. 1 schematically depicts in cross section a sensor system according to an embodiment of the invention;

FIG. 2 is a graph which illustrates how effective reflectivity may vary as a function of distance between a diaphragm and a VCSEL which form part of an embodiment of the invention;

FIG. 3 schematically depicts in cross section and as a circuit diagram a further sensor system according to an embodiment of the invention;

Figure 8:
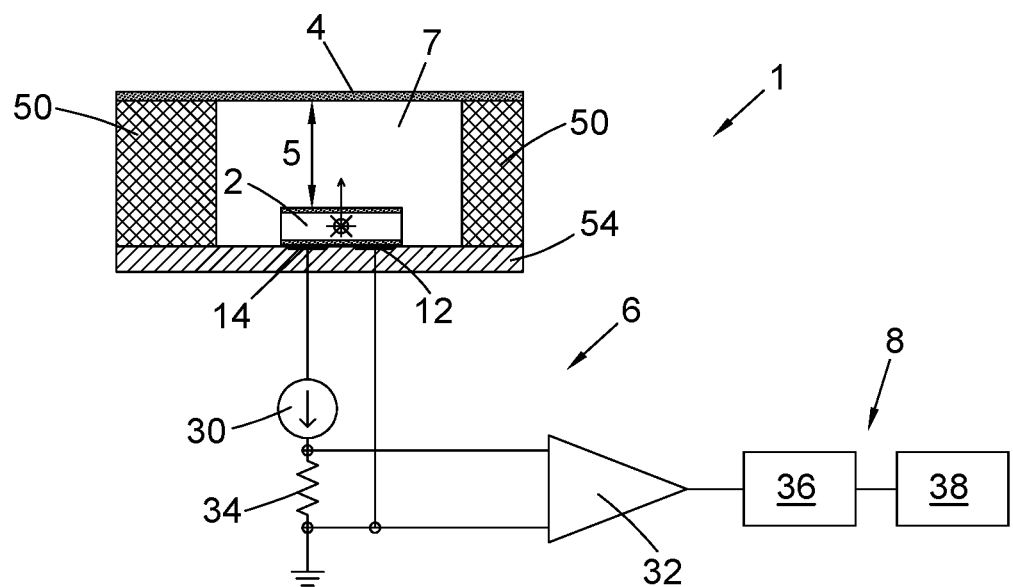
Figure 9:
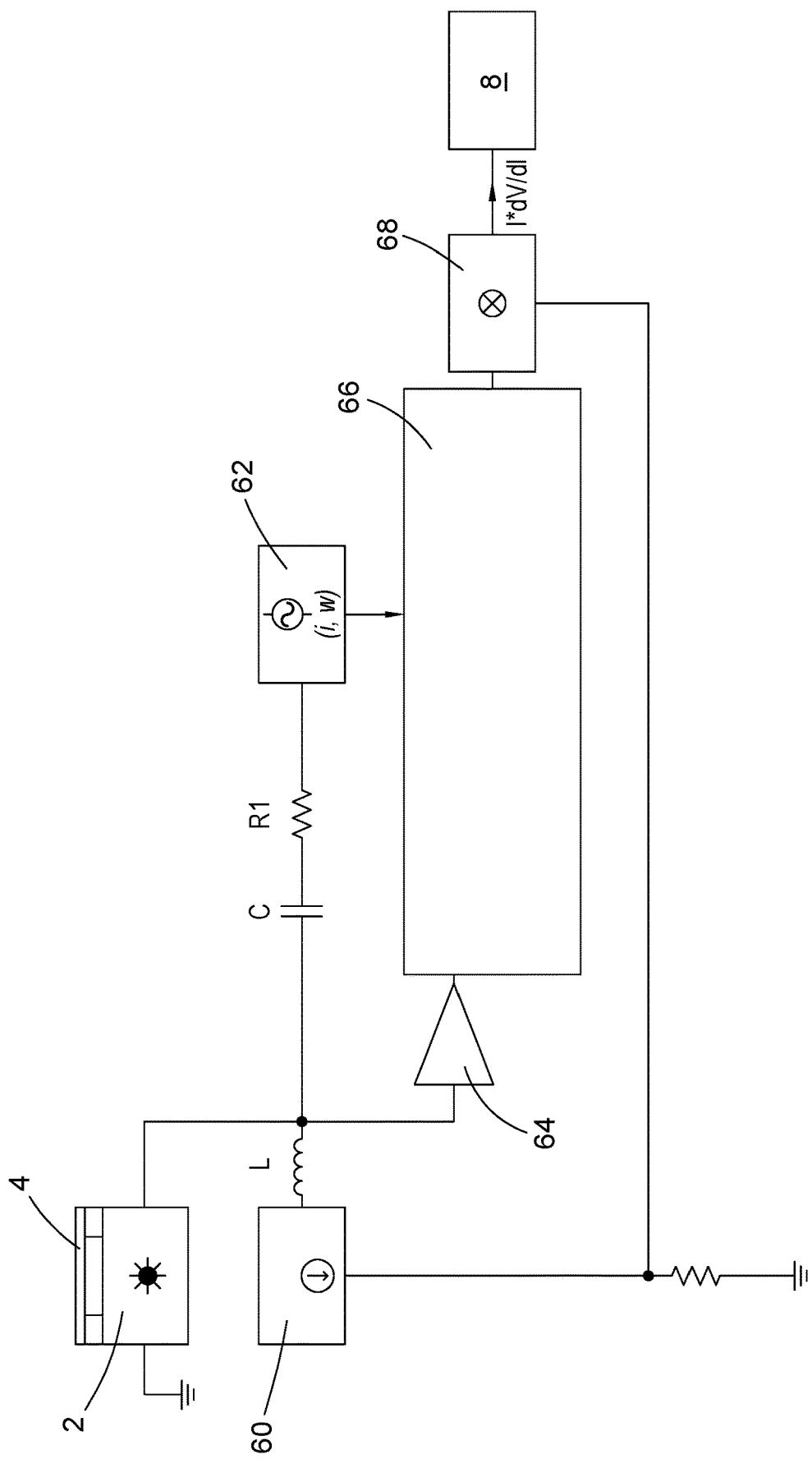
Figure 10:
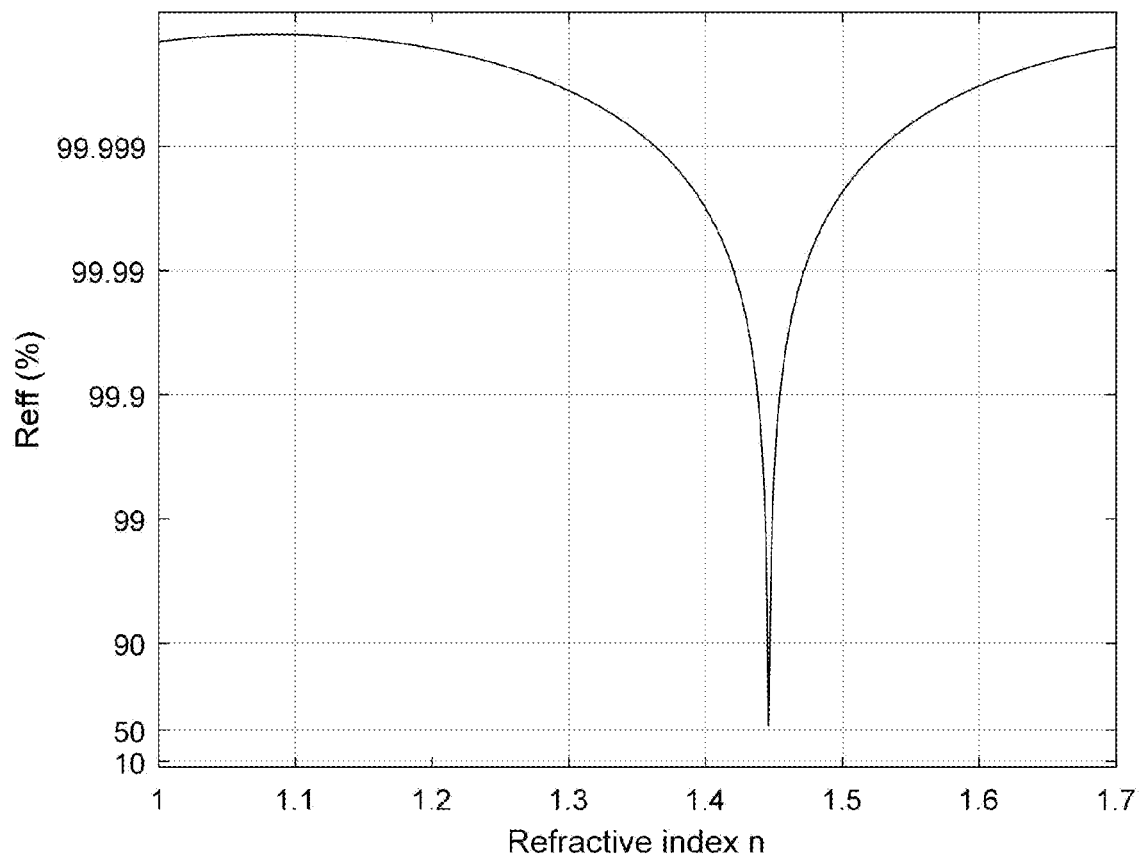
Figure 11:
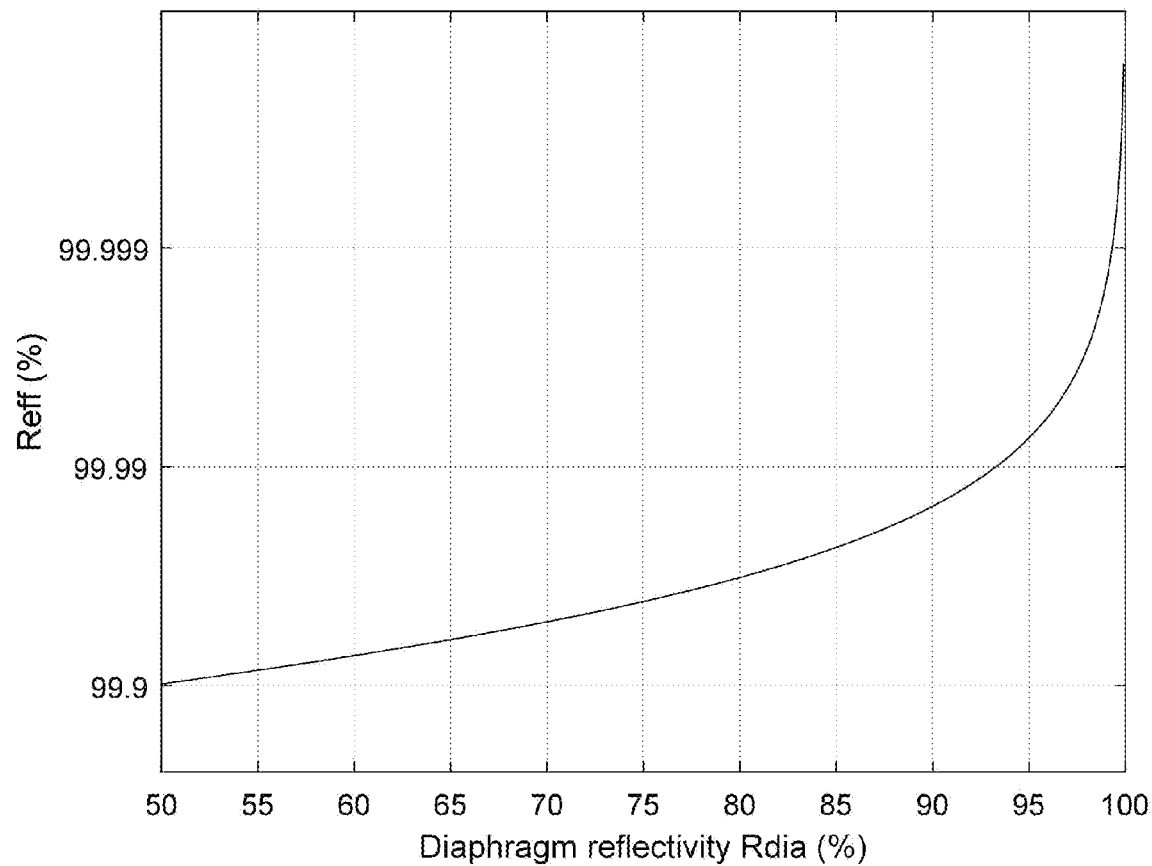
Figure 12:
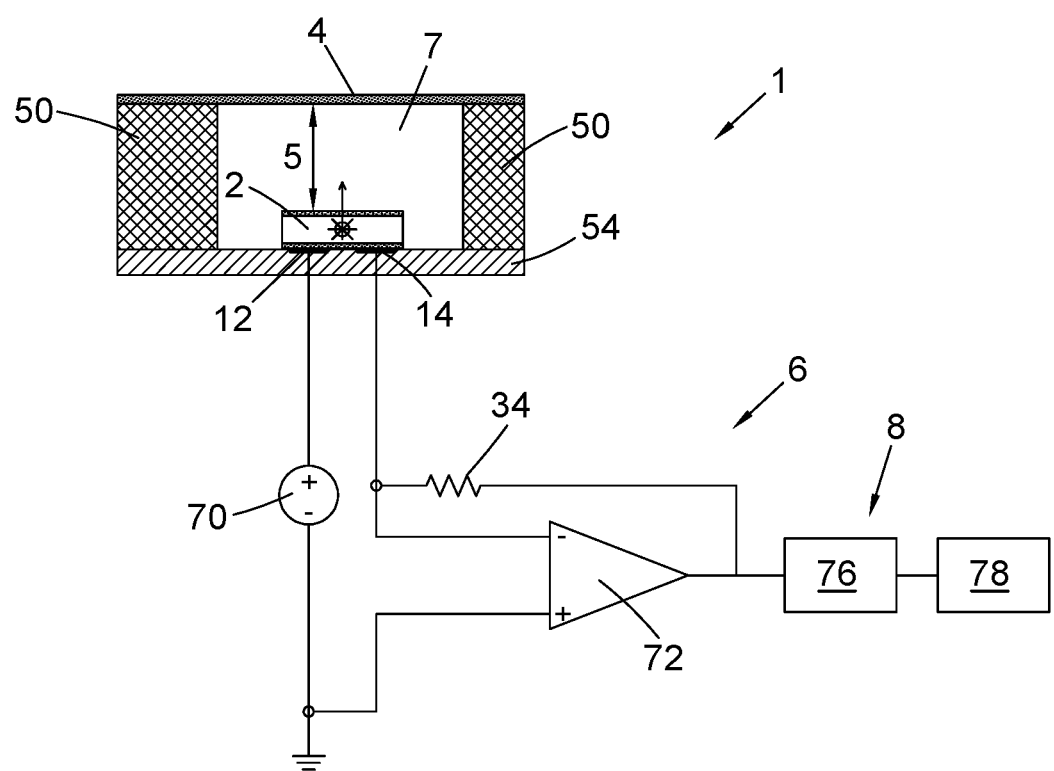

FIG. 8 schematically depicts in cross section and as a circuit diagram a further sensor system according to an embodiment of the invention;

FIG. 9 schematically depicts in cross section and as a circuit diagram a further sensor system according to an embodiment of the invention;

FIG. 10 is a graph which illustrates how effective reflectivity may vary as a function of refractive index in a volume between a diaphragm and a VCSEL which forms part of an embodiment of the invention;

FIG. 11 is a graph which illustrates how effective reflectivity may vary as a function of reflectivity of a diaphragm which forms part of an embodiment of the invention; and FIG. 12 schematically depicts in cross section and as a circuit diagram a further sensor system according to an embodiment of the invention.

DETAILED DESCRIPTION OF THE PREFERRED EMBODIMENTS

Generally speaking, the disclosure provides a sensing method which may be used to sense pressure waves (e.g. audio waves) and/or other properties. The sensor system used to perform the sensing method includes a vertical cavity surface emitting laser (VCSEL) and a diaphragm, and does not require an optical detector such as a photodiode.

Some examples of the solution are given in the accompanying figures.

Figure 1:
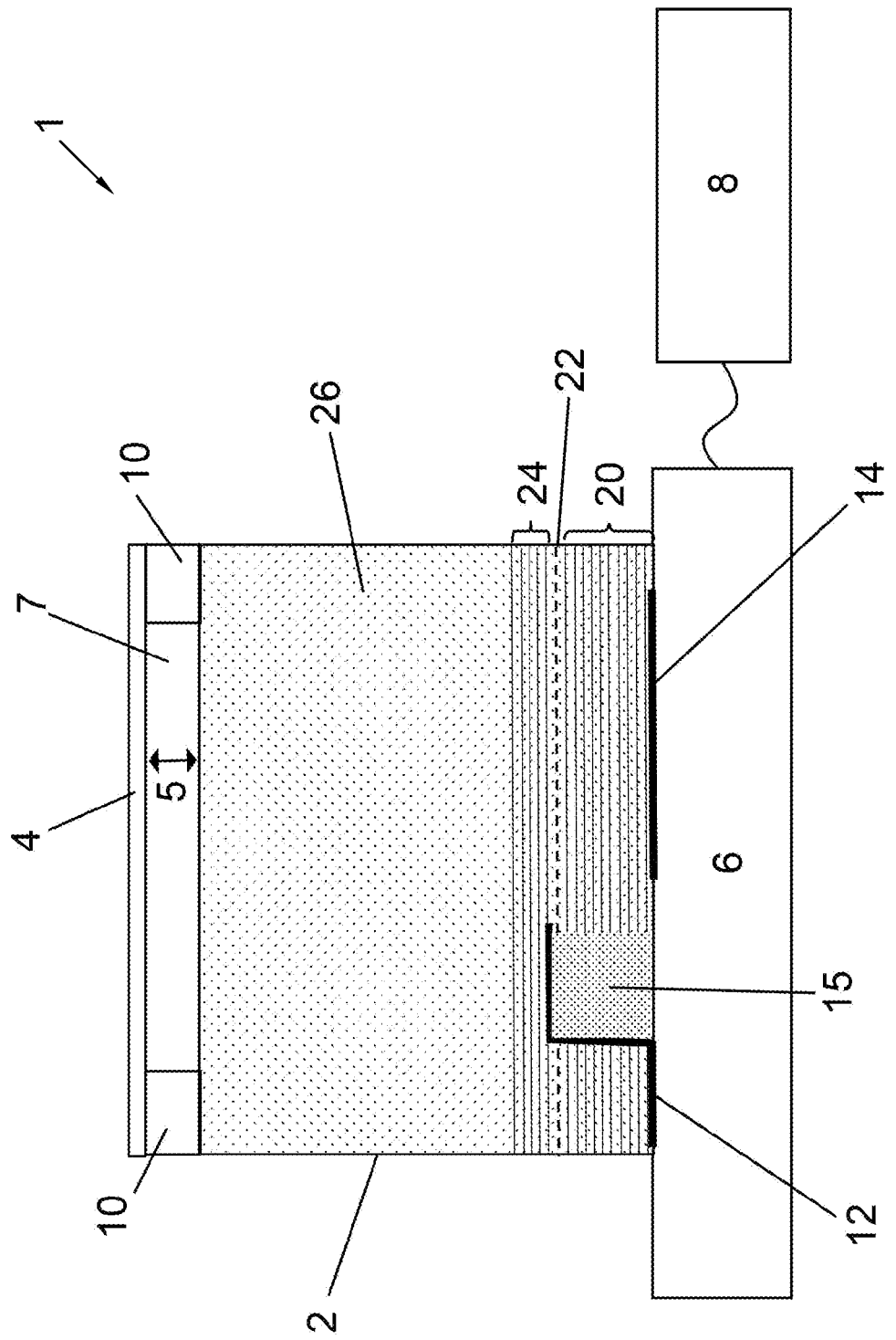

FIG. 1 is a schematic cross sectional depiction of a sensor system 1 according to an embodiment of the present invention. The sensor system comprises a VCSEL 2 a diaphragm 4, driving and sensing electronics 6, and signal processing electronics 8. The diaphragm 4 is provided on an uppermost side of the VCSEL, and is spaced apart from the VCSEL by a spacer 10. The resulting gap 5 defines a volume 7 between the diaphragm and an uppermost surface of the VCSEL 2. The VCSEL is located directly on top of the driving and sensing electronics 6.

The VCSEL 2 comprises a first Bragg reflector 20, a quantum well 22 located above the first Bragg reflector, and a second Bragg reflector 24 located above the quantum well. The Bragg reflectors 20, 24 and the quantum well 22 are all formed in a semiconductor substrate 26. The substrate 26 extends upwardly from the second Bragg reflector 24. The first Bragg reflector 20 is provided in a p-type doped portion of the semiconductor, and the second Bragg reflector 24 is provided in an n-type doped portion of the semiconductor. An anode 12 passes up through the first Bragg reflector 20 and the quantum well 22 and is connected to the n-type semiconductor of the second Bragg reflector 24. A cathode 14 is connected to the p-type semiconductor of the first Bragg reflector 20. An insulator 15 is provided in the semiconductor between the anode 12 and the cathode 14 to prevent electrical conduction between the anode and the cathode.

In an alternative configuration doping of the semiconductor may be swapped, with the first Bragg reflector 20 being n-type and the second Bragg reflector 24 being p-type. Where this is the case the anode 12 and the cathode 14 may also be swapped. In general, for all described embodiments the doping may be swapped together with the anode and the cathode.

The quantum well 22 acts as a gain medium of the VCSEL, and is powered by driving electronics of the driving and sensing electronics 6. The first and second Bragg reflectors 20, 24 reflect photons emitted by the quantum well 22 back towards the quantum well. This reflection of photons back through the quantum well gain medium 22, together with a population inversion established in the quantum well by the driving electronics, causes the VCSEL 2 to oscillate (i.e. function as a laser rather than merely as a light emitting diode). This may be referred to as lasing. The oscillating mode of the VCSEL 2 is a single longitudinal mode.

The diaphragm 4 reflects some of the radiation emitted by the VCSEL 2. The effect of this radiation on the operation of the VCSEL 2 is determined by the phase of the reflected radiation with respect to the single longitudinal mode in the VCSEL. If the reflected radiation is out of phase with the single longitudinal mode, then destructive interference will occur. The VCSEL 2 will continue to oscillate, but it will draw more electrical power from the driving electronics 6. If the reflected radiation is in phase with the standing longitudinal mode then the VCSEL 2 will continue to oscillate, but will require less electrical power from the driving electronics 6. In general, the power required by the VCSEL will vary as a function of the phase of the reflected radiation, and also as a function of the reflectivity of the diaphragm 4. In some instances the VCSEL may have more than one longitudinal mode. Where this is the case the radiation reflected from the diaphragm 4 will still influence the operation of the VCSEL in the same way.

Two regimes can be distinguished, depending upon whether the feedback strength is weak or strong. The line between those two regimes is described in the Tkach and Chraplyvy diagram (JOURNAL OF LIGHTWAVE TECHNOLOGY, VOL. LT-4, NO. 11, NOVEMBER 1986). At a separation between the VCSEL and the diaphragm of 100 to 750 um, a feedback strength higher than 10% can be considered as strong while a feedback strength below 10% can be considered as weak.

In the case of a strong feedback regime, a 3 mirrors model can used. The second Bragg reflector 24 may be referred to as the emission side Bragg reflector. The emission side Bragg reflector 24 and the diaphragm 4 may be considered to act as a single reflector with a single effective reflectivity. The effective reflectivity $R_{eff}$ may be expressed as follows:

$$R_{eff} = \frac{(\sqrt{R_{dia}} - \sqrt{R_{dbr}})^2 + 4\sqrt{R_{dia}R_{dbr}}\sin^2(\theta - \theta_r)}{(1 - \sqrt{R_{dia}R_{dbr}})^2 + 4\sqrt{R_{dia}R_{dbr}}\sin^2(\theta - \theta_r)} \quad (1)$$

Where $R_{dia}$ is the reflectivity of the diaphragm 4, $R_{dbr}$ is the reflectivity of the second Bragg reflector 24, $\theta$ is the phase between longitudinal mode of the VCSEL 2 and the diaphragm 4. The phase $\theta$ is:

$$\frac{2\pi nd}{\lambda} \quad (2)$$

where n is the refractive index of gas (an example of which is air) in the volume 7 between the diaphragm 4 and the VCSEL 2, d is the distance between the diaphragm 4 and the VCSEL 2, and $\lambda$ is the wavelength of the laser beam emitted by the VCSEL.

The final parameter of equation (1) is $\theta_r$. This may be referred to as the corrective phase, and is a fixed phase term which for example may arise from the reflectivity of the diaphragm 4. For the purpose of this explanation it may be set to zero.

Figure 2:
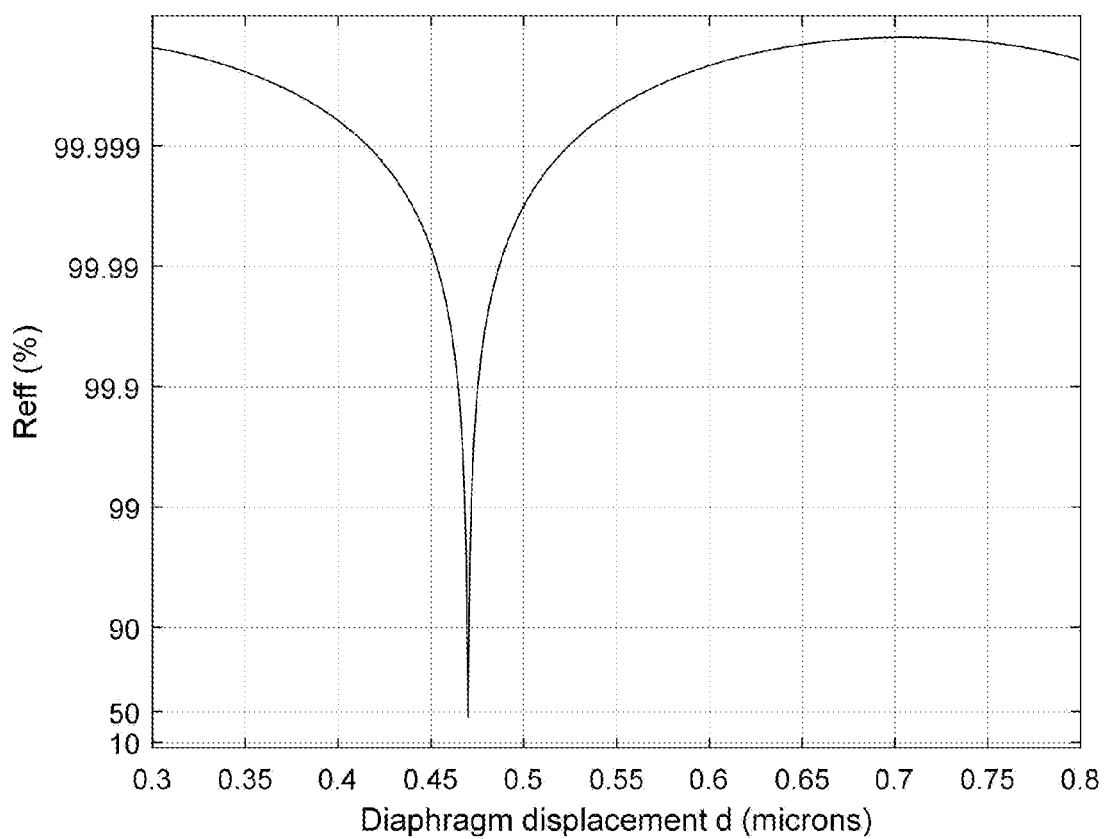

As will be understood from equation 1, a variation d of the distance between the diaphragm 4 and the VCSEL 2 diaphragm will change the effective reflectivity $R_{eff}$. This is depicted in FIG. 2, which is a graph showing how the effective reflectivity $R_{eff}$ changes as a function of diaphragm position, for a simulation in which $R_{dia}$ is 99.9% and $R_{dbr}$ is 99.5%. The wavelength used in the simulation was 940 nm.

As may also be understood from equation 1, a variation of the refractive index n of the gas in the volume 7, or of the reflectivity $R_{dia}$ of the diaphragm will also change the effective reflectivity $R_{eff}$. Since the lasing threshold of the VCSEL 2 depends upon the effective reflectivity $R_{eff}$, it follows that changing any of d, n or $R_{dia}$ will change the lasing threshold of the VCSEL 2. The following description deals first with embodiments directed towards changes of d, then deals with embodiments directed towards changes of n, and finally deals with embodiments directed towards changes of $R_{dia}$.

In the case of weak feedback strength, a model of self-mixing interferometry SMI applies. Conceptually, the principle is the same as described in the 3 mirrors model above but it also takes into account the dynamic behaviour of the photons and charges in the laser itself. This model starts from the rate equations of the laser as explained by Lang-Kobayashi (IEEE JOURNAL OF QUANTUM ELECTRONICS, VOL. QE-16, NO. 3, MARCH 1980) and solves it in the steady-states regime. That leads to the excess phase equation expressed as follow:

$$0 = \phi - \phi 0 + C^*\sin(\phi + \arctan(\alpha)) \quad (3)$$

Where $\phi = 2*\pi*n*d/\lambda$ is the phase and $\phi 0$ is the unperturbed phase. Like in the 3 mirrors model, n is the refractive index of gas (an example of which is air) in the volume 7 between the diaphragm 4 and the VCSEL 2, d is the distance between the diaphragm 4 and the VCSEL 2, and $\lambda$ is the wavelength of the laser beam emitted by the VCSEL. C is the coupling strength and $\alpha$ is the linewidth enhancement factor.

In an embodiment, the sensor system 1 is provided at a location where pressure waves (e.g. acoustic waves) will be incident upon the diaphragm 4. For example, the sensor system 1 may be provided in a mobile phone at a position where the diaphragm 4 is exposed to the air (e.g. via a hole provided in a housing of the mobile phone). In such an arrangement when pressure waves (e.g. acoustic waves) are incident upon the mobile phone they will cause the diaphragm 4 to move. This movement of the diaphragm 4 will change the phase of the radiation reflected by the diaphragm with respect to the single longitudinal mode of the oscillating VCSEL 2. As a result, the electrical power drawn by the VCSEL 2 from the drive electronics 6 will also change.

Figure 3:
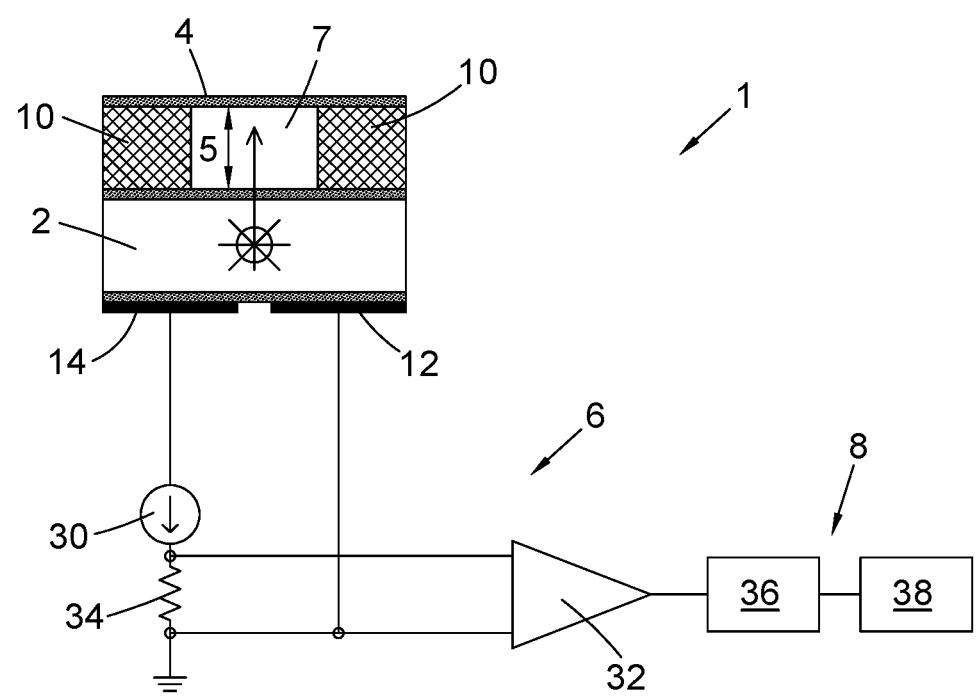

An embodiment is depicted in FIG. 3. The embodiment is similar to the embodiment depicted in FIG. 1, but with the VCSEL 2 shown in simplified form, and with components of drive and sensing electronics 6 depicted in a circuit diagram form. For brevity, features described above in connection with FIG. 1 will not be described in connection with FIG. 3. The cathode 14 is connected to a constant current source 30, which is configured to supply a constant current to the VCSEL via the cathode 14. The constant current source 30 comprises the drive electronics in this embodiment. An operational amplifier 32 is configured to receive a voltage across the VCSEL 2. This is achieved by connecting the operational amplifier 32 to a resistor 34 which is connected between the constant current source 30 and ground. The operational amplifier may have a high input impedance and is AC coupled to the VCSEL. An output from the operational amplifier 32 passes to signal processing electronics 8. Although the signal processing electronics 8 is shown as being separate from the driving and sensing electronics 6, these may all be provided as single integrated circuit.

To use the sensor system 1, a current is supplied to the VCSEL 2, the current being above the threshold for lasing of the VCSEL. Pressure waves such as acoustic waves are incident upon the diaphragm 4 and cause the diaphragm to move. This changes the distance 5 between the diaphragm and the VCSEL 2. As explained further above, this in turn changes the lasing threshold of the VCSEL 2. The current supplied to the VCSEL 2 is sufficiently high that lasing continues even if the threshold increases. The voltage across the VCSEL changes as a function of the diaphragm position (as explained further below). The output from the operational amplifier 32 therefore is a voltage signal which corresponds with movement of the diaphragm 2. The signal processing electronics 8 comprises an analogue to digital convertor 36 and a digital signal processor 38. The signal processing electronics 8 may comprise other components. The voltage signal is thus converted into a digital form and then processed. Processing of a signal generated by acoustic waves is well known in the art and is therefore not described here.

In an embodiment, the VCSEL 2 may be constructed to emit light at any wavelength from UV (wavelength=300 nm) to mid-infrared (wavelength=2 um). In an embodiment the VCSEL 2 may be constructed to emit infrared radiation (i.e. radiation with a wavelength of 860 nm or more). This may be preferred because it requires less power than emission at UV wavelengths and is not visible to users. In an embodiment, the VCSEL 2 may be formed from semiconductor. For example, the VCSEL may have a construction which is based on Gallium Arsenide (GaAs) but it could be made from Gallium Nitride (GaN) as well or other semiconductor material. For example, the quantum well 22 may be formed from Indium Gallium Arsenide (InGaAs), with quantum well barriers (not depicted) formed by GaAs. In another example, the VCSEL may be based on GaInNAs (GINA). This may provide longer wavelength operation. Confinement layers (not depicted) formed from AlGaAs, may be provided by the side of the quantum well barriers. The first Bragg reflector 20 may for example be formed from alternating layers of p-doped AlGaAs and GaAs. The emission side Bragg reflector 24 may be formed from alternating layers of n-doped AlGaAs and GaAs.

The emission side Bragg reflector 24 may have less alternating layers than the first Bragg reflector 20, and a result may have a lower reflectivity. For example, the first Bragg reflector 20 may have around thirty alternating layers, whereas the emission side Bragg reflector 24 may have around fifteen alternating layers (other numbers of layers may be used). In general, the emission side Bragg reflector may have around half as many alternating layers as a first Bragg reflector. Because the emission side Bragg reflector 24 has a lower reflectivity, it acts as an output coupler, i.e. radiation passes through the emission side Bragg reflector 24. The laser beam which is emitted by the VCSEL 2 is preferentially emitted through the emission side Bragg reflector 24, and passes through the substrate 26 to the diaphragm 4.

The diaphragm 4 may be formed from any suitable material. For example, the diaphragm may be formed from Si, SiN or polycrystalline Si. The diaphragm may for example have a thickness in the range 20 nm to 500 nm (e.g. 50 nm or more). The diaphragm may be formed from a so-called 2D material (i.e. one which generally has a thickness of one atom or is formed from a material with a thickness of one atom). An example of a 2D material that may be used is Graphene. When a 2D material is used, the diaphragm may have a thickness of less than 100 nm. The gap 5 between the diaphragm 4 and the uppermost surface of the VCSEL 2 may for example be 100 microns or more. The gap 5 may be up to 750 microns. A typical gap may be 500 microns (plus or minus 100 microns). The size of the gap 5 between the diaphragm 4 and the VCSEL 2 is determined by the spacer 10. The spacer 10 may for example be formed from Si.

A hole (not depicted) may be provided in the diaphragm 4. This will allow some air (or other gas) to move into and out of the volume 7 between the diaphragm 4 and the VCSEL 2. If the hole were not provided then air (or other gas) trapped between the diaphragm 4 and the VCSEL 2 could inhibit movement of the diaphragm such that it is less sensitive to pressure waves such as acoustic waves. The hole may be sufficiently large to allow flow of gas into and out of the volume. The hole may have a diameter of at least 1 micron. The hole may be sufficiently small that it does not affect the response of the diaphragm 4 to pressure waves at acoustic frequencies. The hole may have a diameter of up to 4 microns. The hole may be referred to as a pressure equalisation hole.

Although a particular configuration of sensor system is depicted in FIG. 1, other configurations may be used. For example, the VCSEL 2 is located directly on top of the driving and sensing electronics 6, whereas in other embodiments the driving and sensor electronics 6 may be located separately from the VCSEL with connections extending between them.

In the depicted embodiment the quantum well 22 and Bragg reflectors 20, 24 are located at the bottom of the VCSEL 2. Such an arrangement is referred to as a bottom-emitting VCSEL. In an alternative embodiment the quantum well and first and emission side Bragg reflectors may be located at the top of a VCSEL (i.e. adjacent to the spacer 10). Such an arrangement may be referred to as a top-emitting VCSEL. A bottom-emitting VCSEL may be preferred because it is easier to connect the anode and cathode to the VCSEL. Specifically, the VCSEL may be bonded directly to the anode and cathode.

This provides for easier and thus cheaper fabrication than using wire bonds, and also provides a more robust system (wire bonds are difficult to attach and are prone to breaking). In general, the VCSEL of embodiments of the invention may be bonded directly to an anode and cathode. A top emitting VCSEL may be directly bonded to an anode and a cathode, and this may be preferable to using wire bonds. However, a directly bonded top-emitting VCSEL will emit a laser beam which passes through a support (which may be referred to as a support substrate) that holds the sensor system 1. In such an arrangement a support which does not absorb the emitted radiation (or has sufficiently low absorption to allow the invention to function at a relatively high signal to noise ratio) may be used. Although not preferred, wire bonds may be used.

Figure 4:
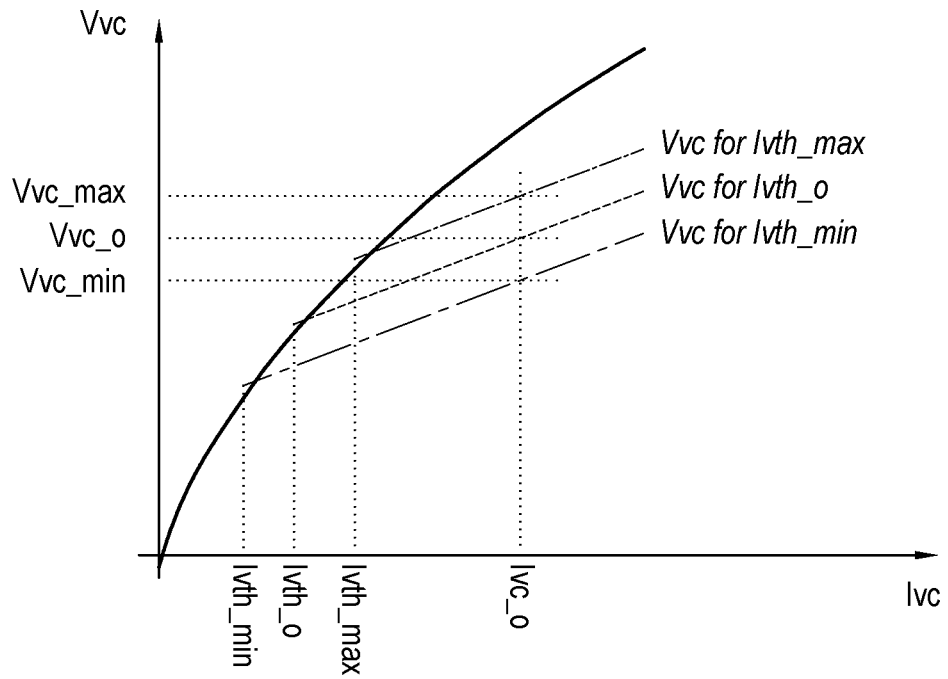
FIG. 4 is a graph which illustrates voltage versus current for a VCSEL which may form part of an embodiment of the invention.

FIGS. 4 to 7 are a set of graphs which depict the response of the VCSEL 2 when an acoustic wave is incident upon the diaphragm 4. Referring first to FIG. 4, when current is supplied to the VCSEL at a level which is not sufficient to cause oscillation of the VCSEL, the voltage-current characteristic is that of a p/n diode (i.e. it is a logarithmic function). The point at which the VCSEL starts to oscillate (when lasing begins) may be referred to as the threshold of the VCSEL. When the current reaches the VCSEL threshold, the junction voltage of the VCSEL (i.e. the voltage across the VCSEL) saturates. This is due to "pinning" of the separation of electron and hole quasi-Fermi levels when oscillation occurs. This is because during oscillation there is a high rate of stimulated emission of photons, together with associated de-excitation of electron and hole pairs. Consequently, electrons and holes do not continue to accumulate at ever higher energies, causing ever higher quasi-Fermi levels. Instead, a population of electrons and holes with quasi-Fermi levels which correspond to the oscillation wavelength is established (a dynamic equilibrium occurs in which electron hole pairs are generated by the current supplied to the VCSEL and are depleted by stimulated emission).

Because the separation of the electron and hole quasi-Fermi levels is pinned, the resistance of the VCSEL is fixed when oscillation occurs. As a result, the voltage-current characteristic changes from being a logarithmic function to being a straight line. This is depicted in FIG. 4. The physics behind the voltage-current characteristic of a diode laser is described in detail in P. A. Barnes and T. L. Paoli, "Derivative Measurements of the Current-Voltage Characteristics of Double-Heterostructure Injection Lasers," IEEE Journal of Quantum Electronics, Vol. QE-12, No. 10, October 1976.

The level of current required for the VCSEL to reach threshold and begin to oscillate will depend upon reflections from the first and emission side Bragg reflectors 20, 24 (see FIGS. 1 and 3) and also upon reflection from the diaphragm 4. The effect of the first and second brag reflectors 20,24 on the threshold current does not change over time (the properties of the Bragg reflectors are fixed). However, the effect of the diaphragm 4 upon the threshold current will depend upon the extent to which radiation reflected from the diaphragm interferes constructively or destructively with the single longitudinal mode of the VCSEL.

Figure 5:
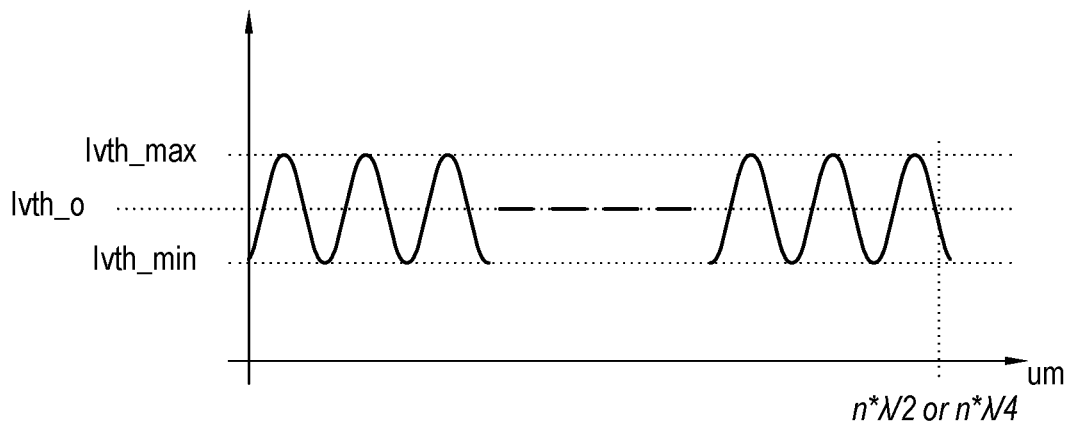
FIG. 5 is a graph which illustrates current versus displacement of a diaphragm relative to a VCSEL which may form part of an embodiment of the invention.

In FIG. 5 the horizontal axis depicts the position of the diaphragm in microns, and the vertical axis depicts the threshold current of the VCSEL (arbitrary units). As shown in FIG. 5, the diaphragm has an initial position in which it provides constructive interference and thus lowers the threshold current. It then moves towards a position in which it provides no net constructive or destructive interference, and thus has no effect on the threshold current. It then moves towards a position in which it provides destructive interference and thus increases the threshold current. In FIG. 5 the pressure wave incident upon the diaphragm 4 causes the diaphragm to move as a sine wave. The threshold current as a result also varies as a sine wave.

Referring to FIGS. 4 and 5 in combination, it may be seen that when supplying a constant current $I_{VC\_O}$ to the VCSEL the voltage $V_{VC}$ across the VCSEL will vary as a function of the position of the diaphragm 4. This is because the change of threshold of the VCSEL changes the voltage to current characteristic of the VCSEL. When the diaphragm 4 provides constructive interference then the voltage $V_{VC}$ across the VCSEL is a minimum $V_{VC\_min}$. When the diaphragm 4 provides destructive interference then the voltage $V_{VC}$ across the VCSEL is a maximum $V_{VC\_max}$. The voltage $V_{VC}$ moves between the minimum and maximum values as the diaphragm 4 moves. In this example the voltage $V_{VC}$ varies as a sine wave.

Figure 6:
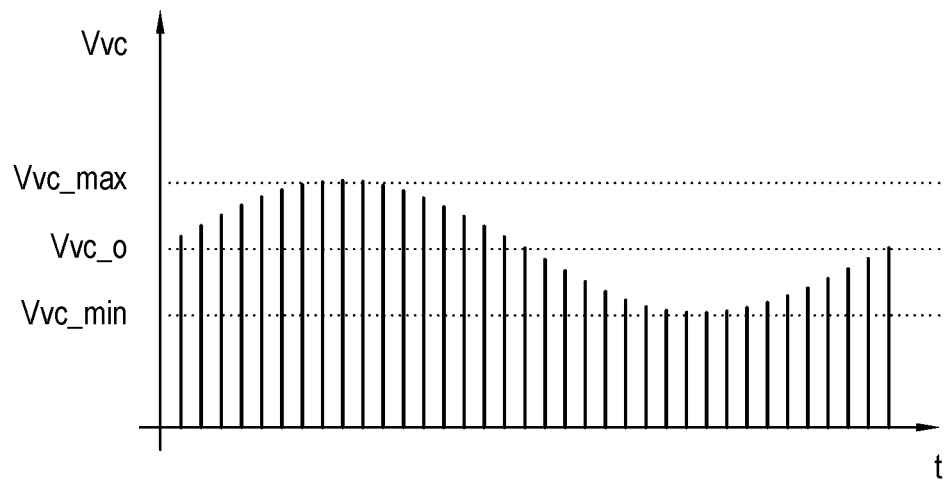
FIG. 6 is a graph which illustrates voltage versus time for a VCSEL and diaphragm which may form part of an embodiment of the invention.

FIG. 6 depicts the voltage seen at the operational amplifier 32 as a function of time. It may be seen that the voltage varies sinusoidally between $V_{VC\_min}$ and $V_{VC\_max}$. The vertical lines in FIG. 6 are present to indicate that the VCSEL 2 may be switched between on and off states in order to reduce power consumption (this may be referred to as chopping). The chopping may for example have a duty cycle of 10% or less (e.g. 5%). The chopping may have a frequency that is higher than frequency of the pressure waves to be detected by the sensor system 1. For example, the sensor system may be configured to detect audio, and the chopping frequency may be 1 MHz or more. Other chopping frequencies may be used. Chopping may alternatively be referred to as modulation.

Figure 7:
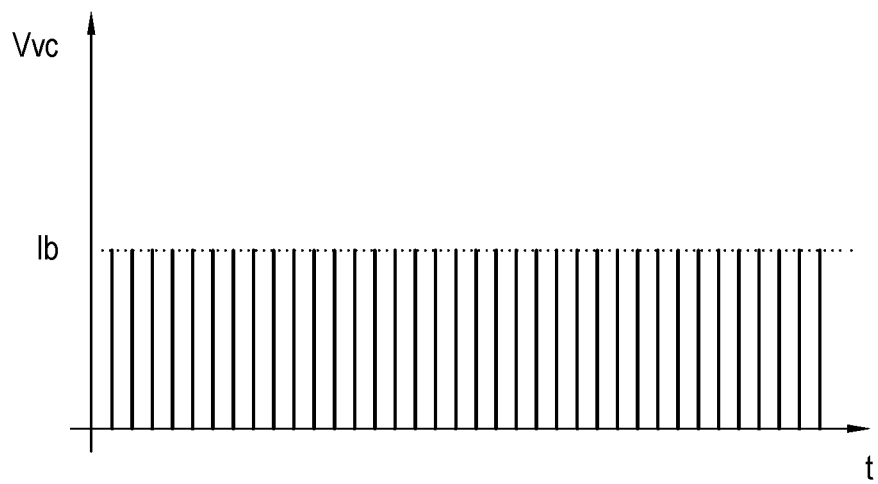
FIG. 7 is a graph which illustrates current versus time which may be delivered to a VCSEL which forms part of an embodiment of the invention.

FIG. 7 depicts an example of the chopped current that may be supplied to the VCSEL 2. As may be seen, the current switches between zero and a single value (the current is not a sine wave). Because the current has a single non-zero value, it may be referred to as a constant current (or a chopped constant current).

Other forms of current modulation (or no current modulation) may be used.

FIG. 8 is a schematic cross sectional depiction of a sensor system 1 according to another embodiment of the present invention. The sensor system again comprises a VCSEL 2 a diaphragm 4, driving and sensing electronics 6, and signal processing electronics 8. However, in this case, the diaphragm is supported by spacers 50 which do not extend from the VCSEL 2 but instead extend from a separate support 54. The support 54 also supports the VCSEL 2. The support 54 may be referred to as a support substrate 54. The support substrate 54 may be formed for example from Si, glass, or other rigid material. The gap 5 between the diaphragm 4 and the uppermost surface of the VCSEL 2 may for example be 100 microns or more. The gap 5 may be up to 750 microns. A typical gap may be 500 microns (plus or minus 100 microns). Other parts of the embodiment correspond with the embodiment depicted in FIG. 1 and are not described again here.

Embodiments of the invention described above may be used for example to detect acoustic waves such as speech or music, or other forms of pressure waves.

An embodiment of the invention may be used to detect vibration, for example vibration at a particular frequency. Vibrations will cause movement of the diaphragm, and this in turn will cause modulation of the electrical power drawn by the VCSEL. Thus, a sensor system according to an embodiment may be used to detect vibrations (the sensor system may act as a vibrometer).

In some systems vibration at a particular frequency is particularly undesirable. For example, in an electric motor vibration at the resonant frequency of the motor (which may also be referred to as the eigenfrequency) should be avoided. An embodiment of the invention may be used to monitor for vibrations at such a frequency. An embodiment configured to monitor for vibrations at a particular frequency is depicted in FIG. 9.

This embodiment shares some features with other embodiments, and to avoid repetition not all features are depicted and described in detail. A diaphragm 4 is provided on a VCSEL 2. A constant current source 60 is configured to supply a constant current to the VCSEL. An oscillator 62 adds a modulated current to a constant current provided by the constant current source 60. The modulation in this embodiment is a sine wave. The sine wave has a frequency which corresponds with the frequency that is to be detected (e.g. a resonant frequency of an apparatus such as an electric motor to which the sensor system is attached).

Sensing electronics monitors the voltage across the VCSEL 2. The sensing electronics comprises a first amplifier 64 (an operational amplifier) which acts as a preamplifier, a lock-in amplifier 66 and a signal multiplier 68. The sensing electronics receives as an input the voltage at the VCSEL, and the sine wave output from the oscillator 62, and provides as an output I*dV/dI (i.e. the drive current multiplied by the first derivative of the current with respect to voltage).

When vibration of the diaphragm 4 occurs outside of the frequency output by the oscillator 62, the lock-in amplifier provides a zero output. However, if vibration occurs at the frequency output by the oscillator 62, then the lock-in amplifier provides a non-zero output. This is mixed with the current supplied to the VCSEL 2 to give a I*dV/dI output. The output passes to processing electronics 8. If the processing electronics 8 determines from its input that vibration is occurring at the monitored frequency (which may be a resonant frequency), then it may issue an alert and/or take remedial action.

In an embodiment, the sensor system may be used to monitor for changes in pressure which are not caused by acoustic waves but instead are changes of the pressure of the ambient environment. For example, in an aeroplane the pressure in the cabin will decrease as the aeroplane gains altitude. The pressure is regulated such that it does not fall below a predetermined level. The sensor system according to an embodiment of the invention may monitor the pressure in the aircraft cabin. In such an embodiment no hole is provided in the diaphragm 4. As a result, the pressure of air (or other gas) in the volume 7 between the diaphragm 4 and the upper surface of the VCSEL 2 is fixed. If the ambient pressure reduces, this will cause the diaphragm 4 to bend outwards and away from the VCSEL. This in turn will change the threshold voltage of the VCSEA thereby providing a measurement of the ambient pressure. Signal processing electronics may be configured to receive a signal from sensing electronics and convert the signal into a pressure value.

In an embodiment, the sensor system may be used to monitor for changes in the make-up of gas in the vicinity of the sensor system. In such an arrangement, one or more holes may be provided in the diaphragm 4 (and/or in the spacer 10). The hole(s) may be sufficiently large that gas may flow relatively easily into and out of the volume 7 between the diaphragm 4 and the upper surface of the VCSEL 2. The hole(s) may for example have a diameter of at least 1 micron. The hole(s) may for example have a diameter of up to 4 microns. When the make-up of gas in the volume 7 changes, the refractive index of the gas also changes. As a result, the optical path length for laser radiation which travels through the volume 7 to the diaphragm 4 and is then reflected back to the VCSEL 2 will also change. This change of the optical path length changes the phase of the reflected light which passes back into the VCSEL 2, and thus changes the threshold voltage of the VCSEL. This change in optical path length is equivalent to moving the diaphragm 4 closer to the VCSEL 2 (for a reduction in the refracted index of the gas) or further away from the VCSEL (for an increase in the refractive index of the gas). FIG. 10 is a graph which depicts how the effective reflectivity $R_{eff}$ of the diaphragm 4 and the emission side Bragg reflector may change as a function of the refractive index of the gas in the volume 7 ($R_{eff}$ is discussed further above in connection with equation (1)). In the depicted example the wavelength of the laser beam is 940 nm, the reflectivity of the emission side Bragg reflector is 99.5%, the reflectivity of the diaphragm is 99.9%, and the refractive index of gas in the volume 7 is 1. Other values may be used. The separation 5 between the diaphragm 4 and the VCSEL 2 is 0.65 microns. Other values may be used. In general, the separation should be greater than half of the wavelength of the laser beam. In practice a larger separation may be preferred because this may allow gas to flow more easily into the volume 7, and may also provide a larger optical path length change. The diaphragm 4 may be substantially rigid, in order to avoid bending of the diaphragm contributing to a signal output from the sensor system. The diaphragm may for example have a thickness of at least 2 microns.

In an embodiment, the sensor system may be used to monitor for build-up of matter on the diaphragm 4 which changes the reflectivity of the diaphragm. A graph which depicts how the diaphragm reflectivity changes the effective reflectivity $R_{eff}$ of the diaphragm 4 and the emission side Bragg reflector is shown in FIG. 11. In this example the diaphragm is separated from the VCSEL by 0.65 microns, the reflectivity of the emission side Bragg reflector is 99.5% and the refractive index of the gas is 1. Other values may be used. As may be seen, the effective reflectivity changes significantly as the reflectivity of the diaphragm 4 changes. This in turn will have an effect on the electrical power drawn by the VCSEL, thus allowing the presence of the build-up of matter to be detected.

In some of the above embodiments, a known current is applied to the VCSEL 2 and the voltage across the VCSEL is monitored. However, other detection methods may be used. For example, a known voltage may be applied to the VCSEL 2 and the current drawn by the VCSEL may be measured. An embodiment of this is depicted in FIG. 12. For brevity, features described above in connection with FIG. 1 will not be described in connection with FIG. 12. The anode 12 is connected to a constant voltage source 70, which is configured to supply a constant voltage to the VCSEL via the anode 12. The constant voltage source 70 comprises the drive electronics in this embodiment. An operational amplifier 72 is configured to receive a current from the cathode 14 of the VCSEL 2. A resistor 74 is connected in parallel to the operational amplifier 72. This arrangement converts the current from the cathode 14 into an output voltage. The output voltage from the operational amplifier 72 passes to signal processing electronics 8. The signal processing electronics 8 comprises an analogue to digital convertor 76 and a digital signal processor 78. Although the signal processing electronics 8 is shown as being separate from the driving and sensing electronics 6, these may all be provided as single integrated circuit.

The diaphragm may also be referred to as a membrane.

In general, the electrical power delivered to the VCSEL may be monitored.

The following describes one method of providing a diaphragm of a VCSEL:

Create posts on the VCSEL to support the future diaphragm. This can be done in a couple of ways for example: 1) pattern and etch existing top semiconductor layers into posts, or 2) deposit a specific layer (dielectric, spin-on-glass, or other) and then pattern and etch that layer into posts.

Deposit a sacrificial layer of a desired thickness on top of the VCSEL. The thickness corresponds with the distance that will be provided between the diaphragm and the VCSEL. The sacrificial layer may for example be a dielectric material that can be etched with specific chemistry.

Pattern and etch openings into this sacrificial layer on top of the posts.

Deposit a diaphragm layer or group of layers on top of the sacrificial layer. The material used may be impervious to the chemistry used to etch the sacrificial layer.

Remove the sacrificial layer using specific chemistry that does not etch the posts, diaphragm, or the rest of the VCSEL structure.

Although only the depicted embodiment of FIG. 8 includes a support substrate 54, other embodiments may include a support substrate. Although the above method provides the diaphragm on spacers which extend from the VCSEL, a corresponding method may be used to provide the diaphragm on spacers which extend from a support substrate.

In an embodiment, a lens may be provided on top of the VCSEL. The lens may be configured to collimate the laser beam emitted by the VCSEL. This is advantageous because it allows a greater separation between the VCSEL and the diaphragm (which may be useful to accommodate a larger range of motion by the diaphragm).

In an embodiment, the sensor system may comprise an array of VCSELs and associated diaphragms. In one example, an array of VCSELs configured to detect vibrations at different frequencies (e.g. using lock-in amplifier arrangements) may be provided. This will allow simultaneous monitoring for different vibration frequencies. In such an example the frequencies being monitored for may be changed on-the-fly by changing the oscillator frequencies used by the lock-in amplifiers.

A sensor system according to an embodiment of the invention may be used in a sensing method which senses pressure waves (e.g. acoustic pressure), vibrations, ambient pressure changes, changes of gas composition via refractive index change, or build-up of deposits. A sensor system according to an embodiment of the invention may be used for example in a mobile phone, a table computer, a laptop computer, a computer monitor, a car, in an electric motor, or in other apparatuses.

LIST OF REFERENCE NUMERALS

1 Sensor system
2 Vertical cavity surface emitting laser (VCSEL)
4 Diaphragm
5 Gap between diaphragm and VCSEL
6 Driving and sensing electronics
7 Volume between diaphragm and VCSEL
8 Signal processing electronics
10 Spacer
12 Anode
14 Cathode
15 Insulator
20 First Bragg reflector
22 Quantum well
24 Second Bragg reflector (emission side Bragg reflector)
26 Substrate
30 Constant current source
32 Amplifier
34 Resistor
36 Analogue to digital converter
38 Digital signal processor
50 Spacer
54 Support substrate
60 Constant current source
62 Oscillator
64 Amplifier
66 Lock-in amplifier
68 Multiplier
70 Constant voltage source
72 Amplifier
74 Resistor
76 Analogue to digital converter
78 Digital signal processor The skilled person will understand that in the preceding description and appended claims, positional terms such as 'above', 'along', 'side', uppermost, lowermost, top, bottom, etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. A sensing method comprising driving a vertical cavity surface emitting laser (VCSEL) to oscillate and emit a laser beam, using a diaphragm spaced away from a laser beam emitting surface of the VCSEL, the diaphragm having a thickness of 500 nm or less to reflect a portion of the laser beam back into the VCSEL, wherein the diaphragm is supported by a spacer which extends from the laser beam emitting surface of the VCSEL, and monitoring the electrical power drawn by the VCSEL to sense movement of the diaphragm without using a photo-detector.

2. The sensing method of claim 1, wherein pressure waves such as acoustic waves are sensed by the sensing method.

3. The sensing method of claim 1, wherein a hole is provided in the diaphragm.

4. The sensing method of claim 1, wherein the spacer defines a volume between the diaphragm and the VCSEL, wherein the volume is airtight, wherein changes of ambient pressure are sensed by the sensing method.

5. The sensing method of claim 4, wherein no hole is provided in the diaphragm.

6. The sensing method of claim 1, wherein a known current is applied to the VCSEL and a voltage at the VCSEL is monitored.

7. The sensing method of claim 1, wherein a known voltage is applied to the VCSEL and a current at the VCSEL is monitored.

8. The sensing method of claim 1, wherein a constant current is supplied to the VCSEL from a constant current source, wherein an oscillating signal is supplied to the VCSEL from an oscillator, wherein the oscillation signal adds a modulated current to the constant current, and a lock-in amplifier is used to monitor for movement of the diaphragm at a frequency of the oscillating signal.

9. A sensor system comprising a vertical cavity surface emitting laser (VCSEL) and a diaphragm spaced away from a laser beam emitting surface of the VCSEL, the diaphragm having a thickness of 500 nm or less, wherein the diaphragm is supported by a spacer which extends from the laser beam emitting surface of the VCSEL, wherein the sensor system does not include a photo-detector, and wherein the sensor system further comprises drive and sensing electronics configured to provide a known current to the VCSEL and measure a voltage at the VCSEL or to apply a known voltage to the VCSEL and measure a current provided to the VCSEL, and wherein the sensor system further comprises signal processing electronics configured to receive a signal output from the drive and sensing electronics and to use the signal to monitor movement of the diaphragm.

10. The sensor system of claim 9, wherein a hole is provided in the diaphragm.

11. The sensor system of claim 10, wherein the hole has a diameter of at least 1 micron.

12. The sensor system of claim 9, wherein a separation between the diaphragm and the VCSEL is 100 microns or more.

13. The sensor system of claim 9, wherein the VCSEL is a bottom emitting VCSEL.

14. The sensor system of claim 9, wherein the sensing electronics comprises a lock-in amplifier.

15. A sensor system comprising a vertical cavity surface emitting laser (VCSEL) and a diaphragm spaced away from a laser beam emitting surface of the VCSEL, wherein the diaphragm is supported by a spacer which extends from the laser beam emitting surface of the VCSEL, an opening being provided which allows gas to enter a volume between the diaphragm and the VCSEL, wherein the sensor system further comprises drive and sensing electronics configured to provide a known current to the VCSEL and measure a voltage at the VCSEL or to apply a known voltage to the VCSEL and measure a current provided to the VCSEL, and wherein the sensor system further comprises signal processing electronics configured to receive a signal output from the drive and sensing electronics and to use the signal to monitor a change of refractive index of gas in the volume or to monitor a change of reflectivity of the diaphragm.

16. The sensor system of claim 15, wherein the diaphragm has a thickness of 2 microns or more.

17. The sensor system of claim 1, wherein the spacer includes a hole.

18. The sensor system of claim 1, wherein the VCSEL is disposed over an anode and a cathode and is bonded directly to the anode and the cathode.

\* \* \* \* \*